(12) United States Patent
Motoyama et al.

(10) Patent No.: US 12,538,785 B2
(45) Date of Patent: Jan. 27, 2026

(54) FULLY-ALIGNED AND DIELECTRIC DAMAGE-LESS TOP VIA INTERCONNECT STRUCTURE

(71) Applicant: International Business Machines Corporation, Armonk, NY (US)

(72) Inventors: Koichi Motoyama, Clifton Park, NY (US); Chanro Park, Clifton Park, NY (US); Kenneth Chun Kuen Cheng, Shatin (HK); Hsueh-Chung Chen, Cohoes, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 938 days.

(21) Appl. No.: 17/518,297

(22) Filed: Nov. 3, 2021

(65) Prior Publication Data

US 2023/0134820 A1    May 4, 2023

(51) Int. Cl.
| | |
|---|---|
| *H01L 23/532* | (2006.01) |
| *H01L 21/3213* | (2006.01) |
| *H01L 21/768* | (2006.01) |
| *H01L 23/522* | (2006.01) |

(52) U.S. Cl.
CPC .. *H01L 23/53266* (2013.01); *H01L 21/32139* (2013.01); *H01L 21/76802* (2013.01); *H01L 21/76837* (2013.01); *H01L 21/76877* (2013.01); *H01L 21/76885* (2013.01); *H01L 23/5226* (2013.01)

(58) Field of Classification Search
CPC ......... H01L 23/53266; H01L 21/32139; H01L 21/76802; H01L 21/76837; H01L 21/76877; H01L 21/76885; H01L 23/5226; H01L 21/76841; H01L 21/76897
See application file for complete search history.

(56) References Cited

U.S. PATENT DOCUMENTS

| | | | |
|---|---|---|---|
| 4,536,951 A | 8/1985 | Rhodes et al. | |
| 5,693,568 A | 12/1997 | Liu et al. | |
| 9,613,861 B2 | 4/2017 | Anderson et al. | |
| 9,698,101 B2 | 7/2017 | Greene et al. | |
| 10,276,436 B2 | 4/2019 | Briggs et al. | |
| 10,312,136 B2 | 6/2019 | Singh et al. | |
| 10,354,912 B2 | 7/2019 | Xu et al. | |
| 10,553,485 B2 * | 2/2020 | Zhang | H01L 21/76808 |

(Continued)

*Primary Examiner* — Jonathan Han
(74) *Attorney, Agent, or Firm* — Scully, Scott, Murphy & Presser, P.C.; L. Jeffrey Kelly, Esq.

(57) ABSTRACT

An interconnect structure is provided the includes a top electrically conductive via structure that is fully-aligned to a bottom electrically conductive line structure. The interconnect structure has a maximized contact area between the top electrically conductive via structure and the bottom electrically conductive line structure without metal fangs that are caused by over etching. The dielectric surface of the interconnect dielectric material layer that is adjacent to the top electrically conductive via structure is free of reactive ion etch (RIE) damage. Further, there is no line wiggling since the bottom electrically conductive line structure is formed by a substrative metal etch. Further, there is no via distortion since the via opening used to house the top electrically conductive via structure has a density and aspect ratio that are low enough to avoid via distortion.

18 Claims, 9 Drawing Sheets

(56) References Cited

U.S. PATENT DOCUMENTS

| | | |
|---|---|---|
| 10,685,879 B1 | 6/2020 | Arnold et al. |
| 10,978,343 B2 | 4/2021 | Park et al. |
| 2002/0155693 A1 | 10/2002 | Hong et al. |
| 2015/0056800 A1 | 2/2015 | Mebarki et al. |
| 2016/0163640 A1* | 6/2016 | Edelstein .......... H01L 21/76834 |
| | | 257/751 |
| 2020/0279769 A1* | 9/2020 | Park .................. H01L 21/76834 |

* cited by examiner

FULLY-ALIGNED AND DIELECTRIC DAMAGE-LESS TOP VIA INTERCONNECT STRUCTURE

BACKGROUND

The present application relates to semiconductor technology, and more particularly to a back-end-of-the-line (BEOL) interconnect structure including a top electrically conductive via structure that is fully-aligned to a bottom electrically conductive line structure.

Generally, BEOL interconnect devices include a plurality of circuits which form an integrated circuit fabricated on a BEOL interconnect substrate. A complex network of signal paths will normally be routed to connect the circuit elements distributed on the surface of the substrate. Efficient routing of these signals across the device requires formation of multilevel or multilayered schemes, such as, for example, single or dual damascene wiring, i.e., interconnect, structures.

Within typical BEOL interconnect structures, electrically conductive metal vias run perpendicular to the BEOL interconnect substrate and electrically conductive metal lines run parallel to the BEOL interconnect substrate. Typically, the electrically conductive metal vias are present beneath the electrically conductive metal lines and both features are embedded within an interconnect dielectric material layer.

A fully-aligned via (FAV) process is an effective way to provide an interconnect structure that has enhanced Vbd and reduced via resistance by confining the via in the line below. Moreover, and for 3 nm and beyond technologies, copper interconnects are reaching their limit in terms of resistivity, filling and reliability. Thus, alternative electrically conductive metals such as, for example, ruthenium, are being considered as a viable replacement for copper. For ruthenium interconnects, both subtractive etch schemes and damascenes etch schemes are being considered. However, both schemes have some challenges associated therewith. For example, and for a conventional subtractive etch scheme, dry etching a thick ruthenium film at tighter pitch is very difficult. For a conventional damascene etch scheme, line wiggling is caused by ruthenium fill at tighter pitch. The term "line wiggling" is used throughout the present application to denote the repetitive line critical dimension (CD) variability along lines.

A FAV interconnect structure is needed in which the above problems associated with conventional FAV processes as well as the challenges in using alternative metals are circumvented.

SUMMARY

An interconnect structure is provided the includes a top electrically conductive via structure that is fully-aligned to a bottom electrically conductive line structure. The interconnect structure has a maximized contact area between the top electrically conductive via structure and the bottom electrically conductive line structure without metal fangs that are caused by over etching. The dielectric surface of the interconnect dielectric material layer that is adjacent to the top electrically conductive via structure is free of reactive ion etch (RIE) damage. Further, there is no line wiggling since the bottom electrically conductive line structure is formed by a substrative metal etch. Further, there is no via distortion since the via opening used to house the top electrically conductive via structure has a density and aspect ratio that are low enough to avoid via distortion. The term "fully-aligned" is used throughout the present application to denote that the at least one electrically conductive via structure is not mis-aligned to the underlining metal line.

In one aspect of the present application, an interconnect structure is provided. In one embodiment, the interconnect structure includes an interconnect dielectric material layer embedding both a metal line and at least one electrically conductive via structure. The at least one electrically conductive via structure is fully-aligned to, and is located above, the metal line, and the metal line has a length. A hard mask wall portion is located laterally adjacent to each of a first sidewall and a second sidewall of the at least one electrically conductive via structure, wherein the first sidewall is opposite the second sidewall. A dielectric spacer is present that runs an entire length of the metal line and separates an upper portion of each of the least one electrically conductive via structure and the hard mask wall portion from the interconnect dielectric material layer.

In another aspect of the present application, a method of forming an interconnect structure is provided. In one embodiment, the method includes forming a metal line having a length, wherein the metal line is located on surface of a first diffusion barrier liner and wherein a patterned hard mask is located on the metal line. Next, a flowable dielectric material layer is formed laterally adjacent to the patterned hard mask and the metal line, wherein the flowable dielectric material layer has a topmost surface that vertically offset and located beneath a topmost surface of the patterned hard mask. A dielectric spacer is then formed laterally adjacent to an upper portion of the patterned hard mask and on the topmost surface of the flowable dielectric material layer. Additional flowable dielectric material is then formed laterally adjacent to the dielectric spacer, and on a topmost surface of the flowable dielectric material layer, wherein the additional flowable dielectric material and the flowable dielectric material layer collectively provide an interconnect dielectric material layer. At least one via opening is then formed by removing a portion of the patterned hard mask that is located above the metal line, wherein the at least via opening is fully aligned to the metal line. Next, at least an electrically conductive via structure is formed in the at least one via opening.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
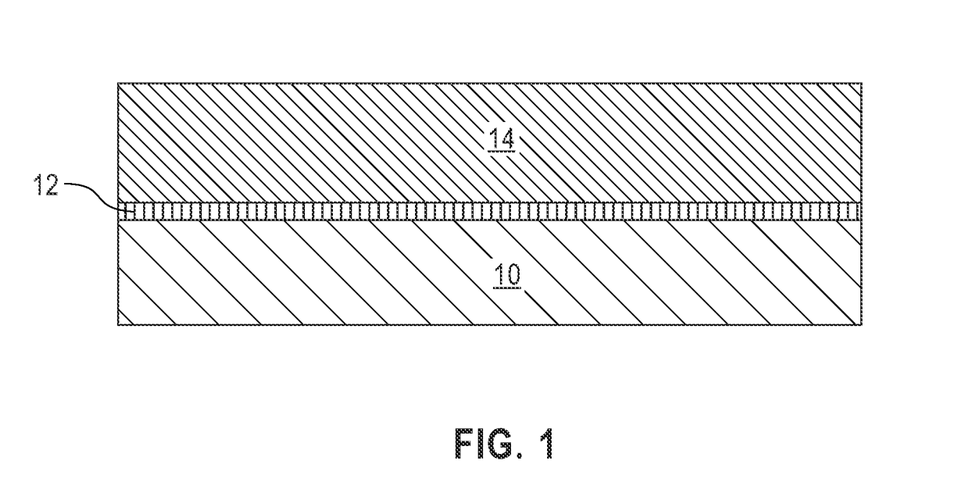
FIG. 1 is a cross sectional view of an exemplary structure that can be employed in accordance with an embodiment of the present application, the exemplary structure including a substrate, a first diffusion barrier layer located on the substrate, and a metal layer located on the diffusion barrier layer.

Referring first to FIG. 1, there is illustrated an exemplary structure that can be employed in accordance with an embodiment of the present application. The exemplary structure illustrated in FIG. 1 includes a substrate 10, a first diffusion barrier layer 12 located on the substrate 10, and a metal layer 14 located on the first diffusion barrier layer 12.

Substrate 10 can include at least one other interconnect level containing electrically conductive structures embedded in an interconnect dielectric material, a middle-of-line (MOL) level containing electrically conductive contact structures embedded in a MOL dielectric material, a front-end-of-the-line (FEOL) level containing one or more semiconductor devices such as, for example, field effect transistors located on a surface of a semiconductor substrate, or any combination of the same.

First diffusion barrier layer 12 is composed of a diffusion barrier material such as, for example, Ta, TaN, Ti, TiN, Ru, RuN, RuTa, RuTaN, W, or WN. The diffusion barrier material serves as a barrier to prevent a conductive material such as the conductive material that provides metal layer 14 from diffusing there through. The thickness of the first diffusion barrier layer 12 can vary depending on the deposition process used as well as the material employed. In some embodiments, the first diffusion barrier layer 12 has a thickness from 2 nm to 50 nm; although other thicknesses for the first diffusion barrier layer 12 are contemplated and can be employed in the present application. The first diffusion barrier layer 12 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Metal layer 14 is composed of a non-copper containing electrically conductive metal or non-copper containing electrically conductive metal alloy. Examples of non-copper containing electrically conductive metals that can be employed include, but are not limited to, Co, Mo, Ru, Rh or Ir. Examples of non-copper containing electrically conductive metal alloys that can be employed include, but are not limited to, a Co-Mo alloy. The metal layer 14 can be formed utilizing a deposition process such as, for example, CVD, PECVD, sputtering, chemical solution deposition or plating. The metal layer 14 can have a thickness from 50 nm to 200 nm; although other thicknesses for the metal layer 14 are contemplated and can be employed in the present application.

Figure 2:
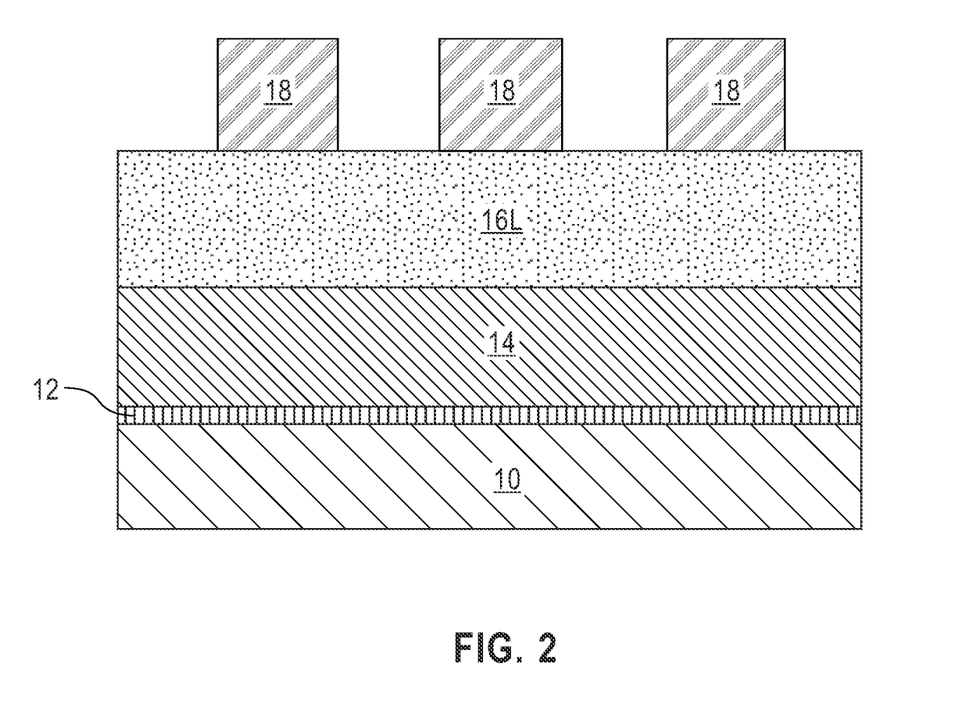
FIG. 2 is a cross sectional view of the exemplary structure shown in FIG. 1 after forming a hard mask material layer and a patterned photoresist.

Referring now to FIG. 2, there is illustrated the exemplary structure shown in FIG. 1 after forming a hard mask material layer 16L and a patterned photoresist 18; in the drawings and by way of illustration three portions of the patterned photoresist 18 are illustrated. As is shown in FIG. 2, the hard mask material layer 16L is formed on a surface of the metal layer 14, and each portion of the patterned photoresist 18 is formed on a surface of the hard mask material layer 16L. The patterned photoresist 18 has a shape of a line or trench. The length of the line or trench extends into and outward from the plane of the paper including FIG. 2.

The hard mask material layer 16L is composed of any dielectric hard mask material. Illustrative dielectric hard mask materials that can be employed in providing the hard mask material layer 16L include, but are not limited to, silicon dioxide, silicon nitride and/or silicon oxynitride. In some embodiments, the dielectric hard mask material can be a nitride of a metal (e.g., TiN) or an oxide of a metal (e.g., TiO). The hard mask material layer 16L can be formed utilizing a deposition process such as, for example, CVD, PECVD, ALD, or PVD. The hard mask material layer 16L can have a thickness from 10 nm to 150 nm; although other thicknesses for hard mask material layer 16L are contemplated and can be employed in the present application.

The patterned photoresist 18 is composed of any photoresist material including for example, a positive tone photoresist material, a negative tone photoresist material or a hybrid tone photoresist material. The patterned photoresist 18 can be formed by depositing one of the aforementioned photoresist materials on the surface of the hard mask material layer 16L. The depositing of the photoresist material can include, but is not limited to, CVD, PECVD or spin-on coating. After depositing the photoresist material, the deposited photoresist material can be patterned by lithography which includes exposing the deposited photoresist material to a desired pattern of irradiation, and developing the exposed photoresist.

Figure 3:
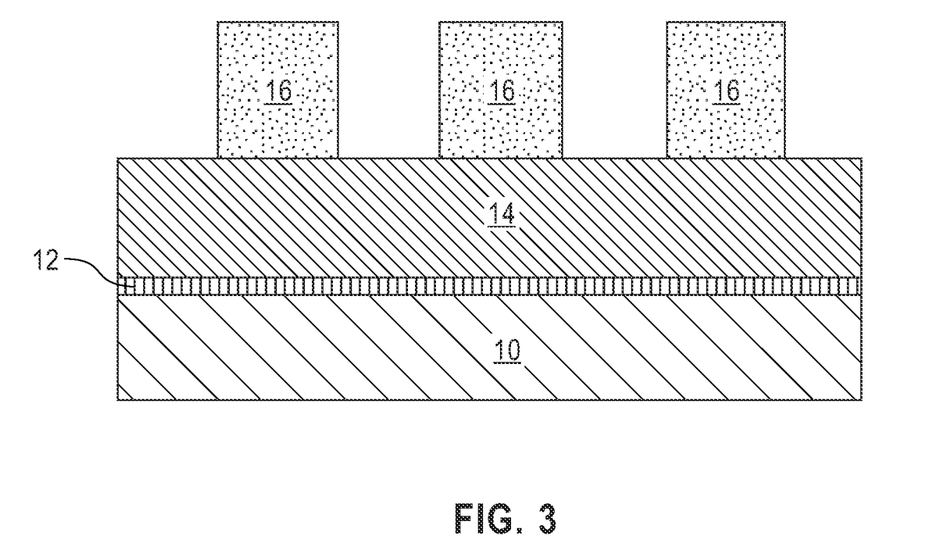
FIG. 3 is a cross sectional view of the exemplary structure shown in FIG. 2 after patterning the hard mask material layer to provide at least one patterned hard mask on the metal layer, and removing the patterned photoresist.

Referring now to FIG. 3, there is illustrated the exemplary structure shown in FIG. 2 after patterning the hard mask material layer 16L to provide at least one patterned hard mask 16 (three separate and spaced apart patterned hard masks 16 are shown in FIG. 3 by way of one example) on the metal layer 14, and removing the patterned photoresist 18.

The patterning of the hard mask material layer 16L utilizes an etch process in which the patterned photoresist 18 is employed as an etch mask. Notably, portions of the hard mask material layer 16L that are not covered (i.e., protected) by the patterned photoresist 18 are removed during the etch process providing patterned hard masks 16. Each patterned hard mask 16 has a shape of a line or trench. The etch process used in patterning the hard mask material layer 16L includes a chemical wet etch or dry etch that is selective in removing the dielectric hard mask material that provides the hard mask material layer 16L. This etch stops on a surface of the metal layer 14. In one example, the etch includes a reactive ion etch. After performing the etch process, the patterned photoresist 18 is removed from the structure utilizing a conventional resist stripping process such as, for example, ashing.

Figure 4A:
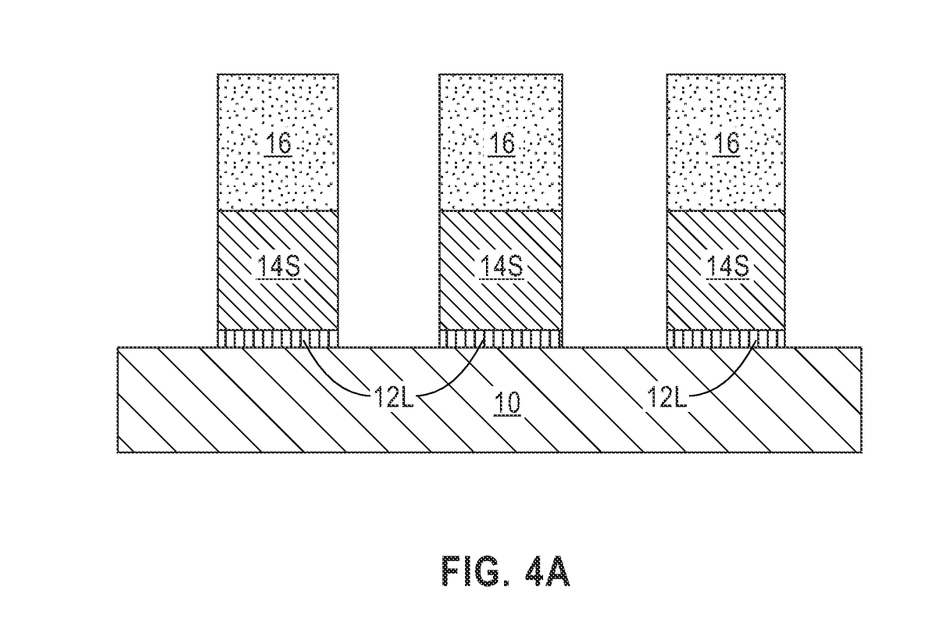
FIG. 4A is a cross sectional of the exemplary structure shown in FIG. 3 after patterning the metal layer and the diffusion barrier layer utilizing the at least one patterned hard mask as an etch mask, wherein the patterning provides at least one patterned line structure including a metal line located on a surface of a first diffusion barrier liner.
Figure 4B:
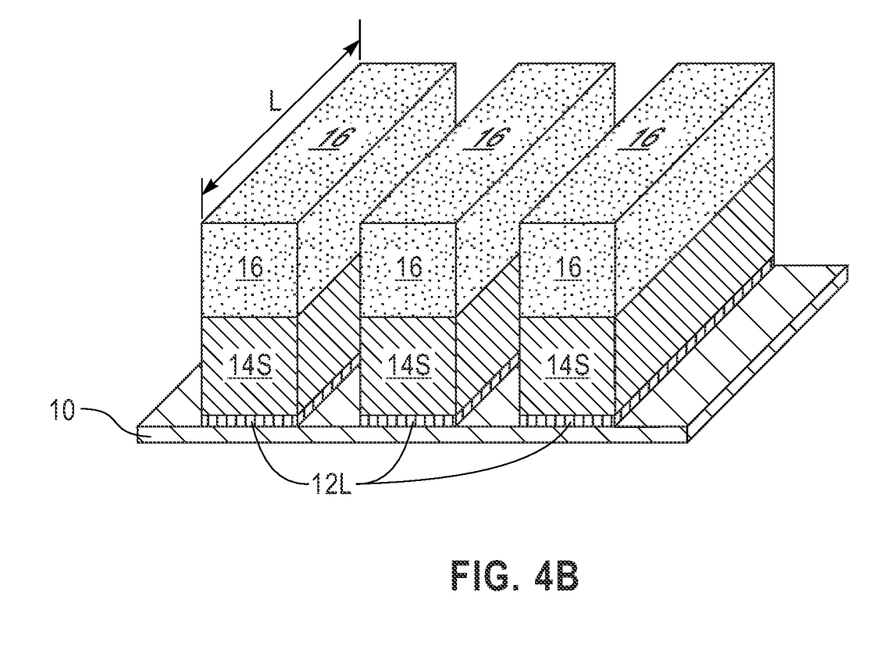
FIG. 4B is a three-dimensional (3D) view of the exemplary structure shown in FIG. 4A.

Referring now to FIGS. 4A and 4B, there are shown the exemplary structure shown in FIG. 3 after patterning the metal layer 14 and the first diffusion barrier layer 12 utilizing the at least one patterned hard mask 16 as an etch mask, wherein the patterning provides at least one patterned line structure including a metal line 14S located on a surface of a first diffusion barrier liner 12L. In FIGS. 4A and 4B, three separate and spaced apart patterned line structures 12L/14S are shown by way of one example. Each metal line 14S has a length, L, as shown in FIG. 4B. Each metal line 14S is formed by a substrative etch process as defined above (See FIGS. 1-4B).

The patterning of the metal layer 14 and the first diffusion barrier layer 12 utilizes an etch process in which each patterned hard mask 16 is employed as an etch mask. Notably, portions of the metal layer 14 and the first diffusion barrier layer 12 that are not covered (i.e., protected) by the patterned hard masks 16 are removed during this etch process providing at least one patterned line structure 12L/14S. Each patterned line structure 12L/14S has a shape of a line or trench. As mentioned above, each patterned line structure includes a metal line 14S (i.e., a remaining non-etched portion of the metal layer 14) located on a surface of a first diffusion barrier liner 12L (i.e., a remaining non-etched portion of the first diffusion barrier layer 12). The etch process used in this step of the present application includes at least one etch (i.e., chemical wet etch, and/or dry etch) that is selective in removing the non-protective portions of at least the metal layer 14. In some embodiments, a single etch can be used to remove the non-protective portions of both the metal layer 14 and the first diffusion barrier layer 12. In other embodiments, a first etch can be used to remove the non-protective portion of the metal layer 14, and a second etch, different from the first etch, can be used to remove the non-protective portions of the first diffusion barrier layer 12. The at least one etch stops on a surface of substrate 10.

Each patterned line structure 12L/14S has outermost sidewalls that are vertically aligned with the corresponding outermost sidewalls of the overlying patterned hard mask 16. The first diffusion barrier liner 12L within a given patterned line structure has outermost sidewalls that are vertically aligned with the corresponding outermost sidewalls of the overlying metal line 14S. Metal line 14S can also be referred to herein as an electrically conductive line structure.

Figure 5:
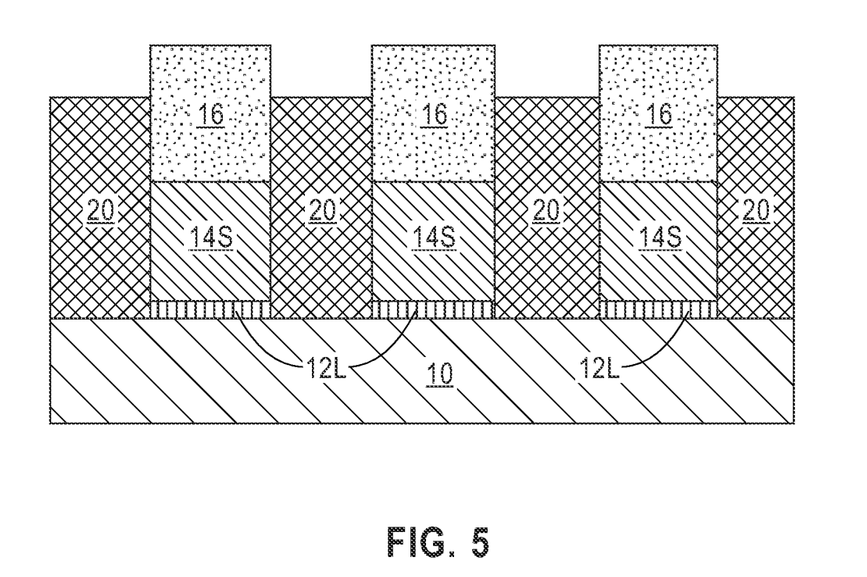
FIG. 5 is a cross sectional view of the exemplary structure shown in FIG. 4A after forming a flowable dielectric material layer laterally adjacent to the at least one patterned line structure, and laterally adjacent to a lower portion of the at least one patterned hard mask that is located on the at least one patterned line structure.

Referring now to FIG. 5, there is illustrated the exemplary structure shown in FIG. 4A after forming a flowable dielectric material layer 20 laterally adjacent to the at least one patterned line structure 12L/14S, and laterally adjacent to a lower portion of the at least one patterned hard mask 16 that is located on the at least one patterned line structure 12L/14S. As is shown, the flowable dielectric material layer 20 does not cover the topmost surface of each of the patterned hard mask 16. That is, the flowable dielectric material layer 20 partially fills in the gaps that are located laterally adjacent to each of the hard mask capped patterned line structures.

In some embodiments of the present application, the flowable dielectric material layer 20 can be composed of a dielectric material that has a dielectric constant of less than 4.0 (all dielectric constants mentioned herein are measured relative to a vacuum unless otherwise stated). Such dielectric materials can be referred to herein as a low-k material. The flowable dielectric material layer 20 can be formed utilizing a deposition process such as, for example, CVD, PECVD or spin-on coating. In some embodiments, a recess etch can be employed to reduce the height of an as deposited low-k material that provides the flowable dielectric material layer 20. The flowable dielectric material layer 20 typically has a topmost surface that is located between a topmost surface and a bottommost surface of the patterned hard mask 16.

Figure 6:
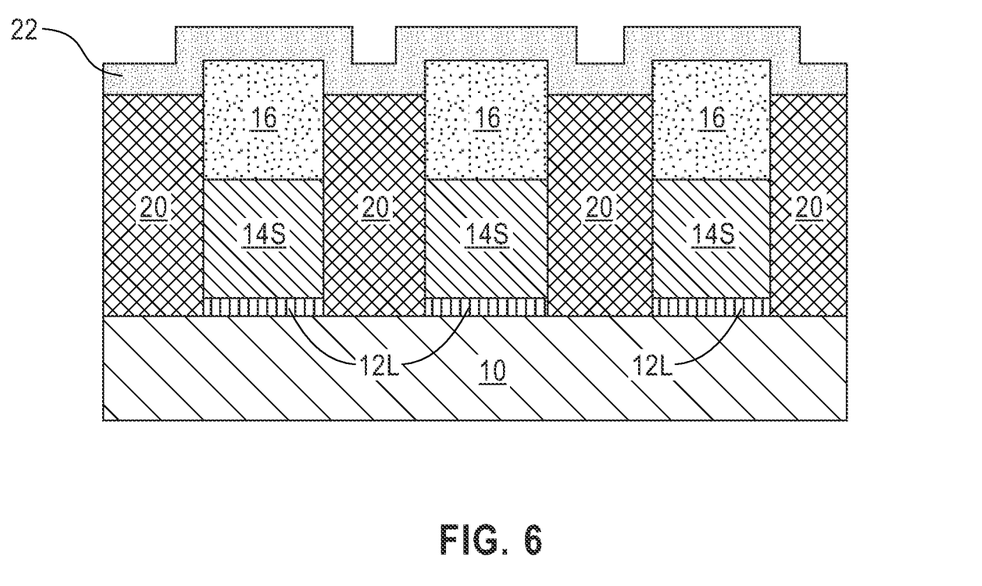
FIG. 6 is a cross sectional view of the exemplary structure shown in FIG. 5 after forming a dielectric spacer material layer on the flowable dielectric material layer and an upper portion of the at least one patterned hard mask.

Referring now to FIG. 6, there is illustrated the exemplary structure shown in FIG. 5 after forming a dielectric spacer material layer 22 on the flowable dielectric material layer 20 and an upper portion of the at least one patterned hard mask 17. The upper portion of the at least one patterned hard mask 16 includes upper sidewall portions and a topmost surface.

The dielectric spacer material layer 22 includes a dielectric spacer material that is compositionally different from the dielectric hard mask material that provides the hard mask material layer 16L and the low-k material that provides the flowable dielectric material layer 20. Illustrative examples of dielectric spacer materials that can be used to provide the dielectric spacer material layer 22 include, but are not limited to, silicon dioxide, silicon nitride, silicon oxynitride, or SiCN. The dielectric spacer material layer 22 can be formed by a deposition process including, but not limited to, CVD, PECVD, PVD, or ALD. The dielectric spacer material layer 22 is typically a conformal material layer. By "conformal material layer" it is meant that a material layer has a thickness along horizontal surfaces that is the same as a thickness of the same material layer along vertical surfaces. The dielectric spacer material layer 22 typically has a thickness from 5 nm to 50 nm; although thicknesses for the dielectric spacer material layer 22 are contemplated and can be employed in the present application.

Figure 7A:
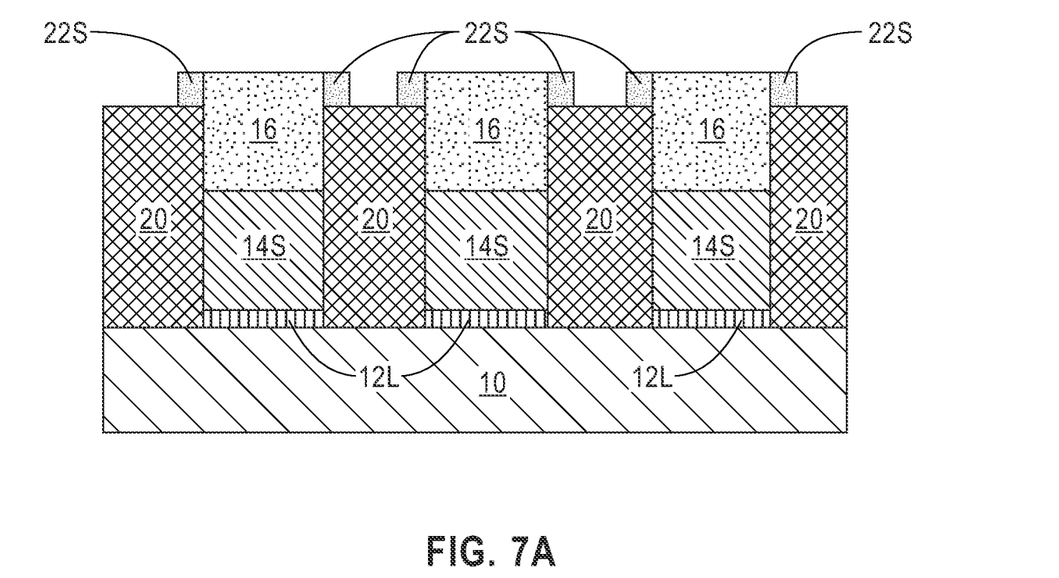
FIG. 7A is a cross sectional view of the exemplary structure shown in FIG. 6 after performing a spacer etch back process on the dielectric spacer material layer to provide dielectric spacers along an upper sidewall portion of the at least one patterned hard mask.
Figure 7B:
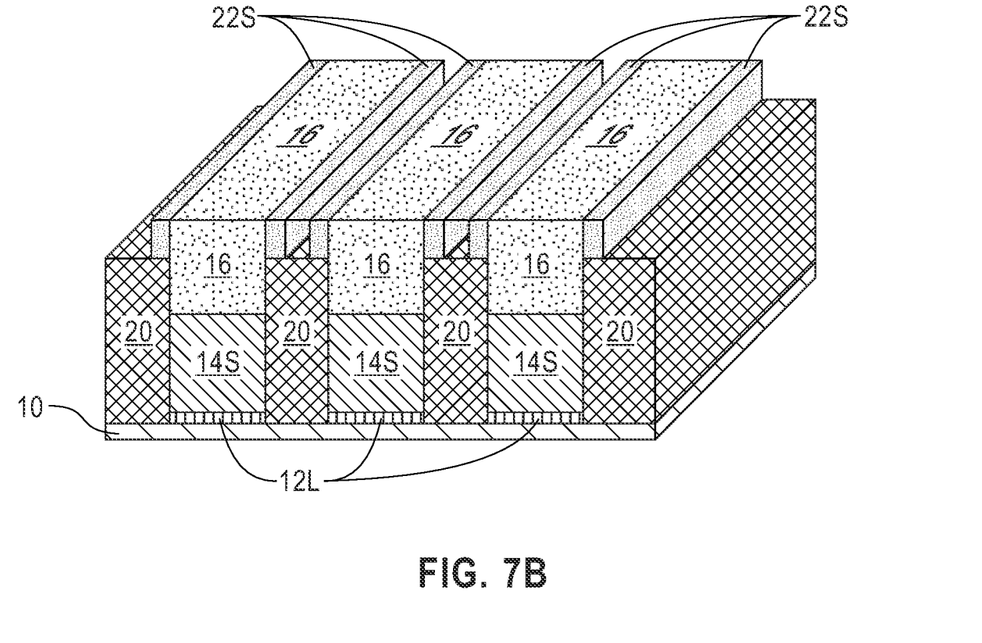
FIG. 7B is a 3D view of the exemplary structure shown in FIG. 7A.

Referring now to FIGS. 7A-7B, there is illustrated the exemplary structure shown in FIG. 6 after performing a spacer etch back process on the dielectric spacer material layer 22 to provide dielectric spacers 22S along an upper sidewall portion of the at least one patterned hard mask 16. The dielectric spacers 22S have a topmost surface that is typically coplanar with a topmost surface of each patterned hard mask 16. The dielectric spacers 22S run along an entire length of the patterned hard mask 16, See FIG. 7B.

Figure 8:
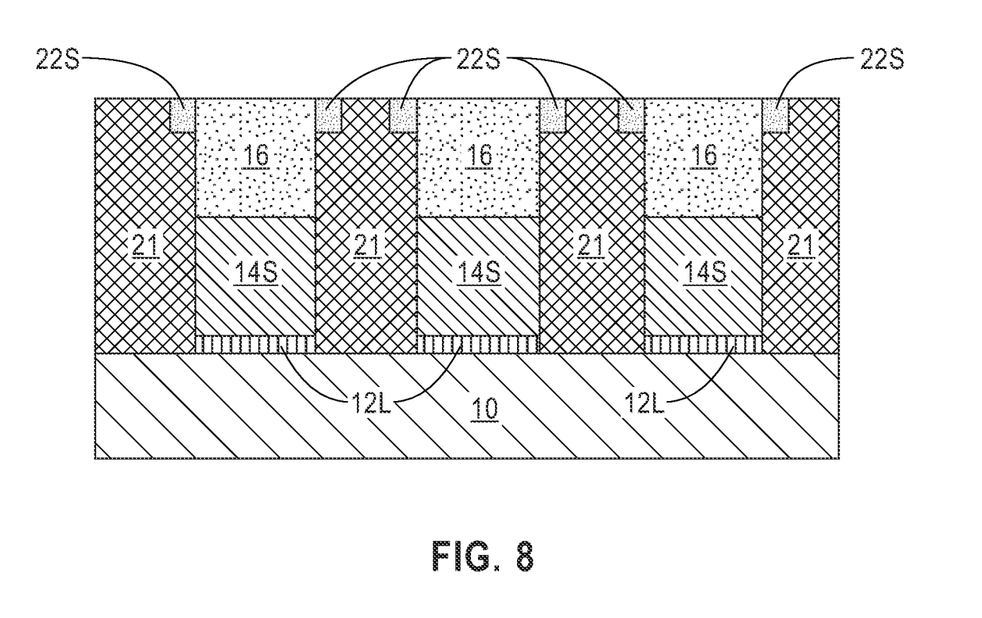
FIG. 8 is a cross sectional view of the exemplary structure shown in FIG. 7A after forming additional flowable dielectric material laterally adjacent to the dielectric spacers and on a surface of the flowable dielectric material layer.

Referring now to FIG. 8, there is illustrated the exemplary structure shown in FIG. 7A after forming additional flowable dielectric material laterally adjacent to the dielectric spacers 22S and on a surface of the flowable dielectric material layer 20. The additional flowable dielectric material is typically, but not necessarily always, composed of a same low-k material as the flowable dielectric material layer 20. Collectively, the additional flowable dielectric material and the flowable dielectric material layer 20 provide an interconnect dielectric material layer 21 of the present application. The additional flowable dielectric material can be formed utilizing one of the deposition processes mentioned above for forming the flowable dielectric material layer 20. A planarization process can follow the deposition of the additional flowable dielectric material to provide interconnect dielectric material layer 21 (composed of a combination of flowable dielectric material layer 20 and the additional flowable dielectric material) that has a topmost surface that is coplanar with a topmost surface of the dielectric spacers 22S and a topmost surface of the patterned hard masks 16.

Figure 9A:
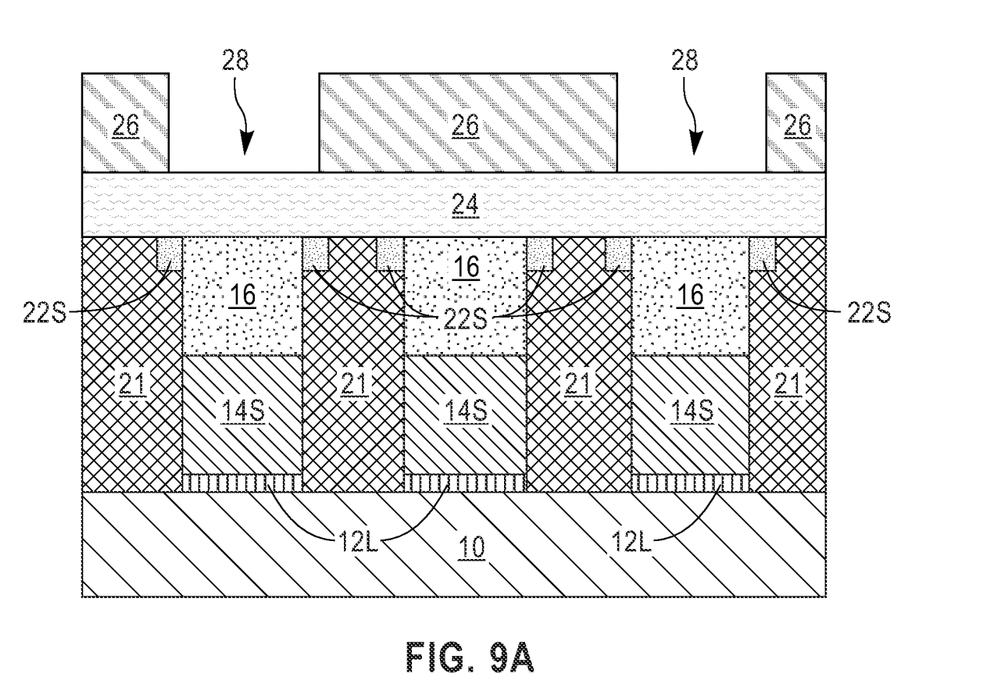
FIG. 9A is a cross sectional view of the exemplary structure shown in FIG. 8 after forming a masking layer and another patterned photoresist, wherein the another patterned photoresist includes a via opening that is located above a portion of the at least one patterned line structure including the metal line.
Figure 9B:
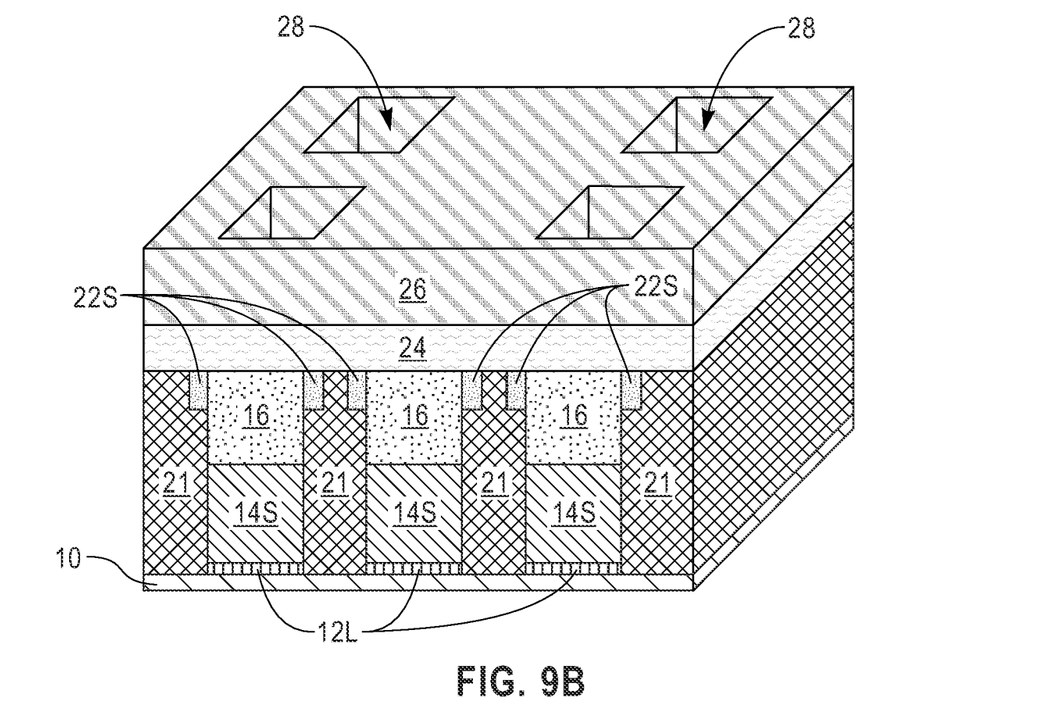
FIG. 9B is a 3D view of the exemplary structure shown in FIG. 9A.

Referring now to FIGS. 9A-9B, there are shown the exemplary structure shown in FIG. 8 after forming a masking layer 24 and another patterned photoresist 26, wherein the another patterned photoresist 26 includes a via opening 28 that is located above a portion of the at least one patterned line structure including the metal line 14S. In the drawings, two via openings 28 are shown by way of one example. Note that a via opening 28 is not required to be formed above each of the patterned line structures; some of the patterned line structures (illustrated by the middle patterned line structure shown in FIGS. 9A and 9B) are protected by the another patterned resist 26 and thus will not be processed to include any via openings.

The masking layer 24 includes any conventional masking material such as, for example, an organic planarization layer (OPL). The masking layer 24 can be formed utilizing a deposition process including, for example, CVD, PECVD, PVD, or spin-on coating. The masking layer 24 can haver a thickness from 20 nm to 100 nm; although other thicknesses are contemplated and can be used in the present application as the thickness of the masking layer 24.

The another patterned resist 26 can include one of the photoresist materials mentioned above for patterned resist 18. The another patterned resist 26 can be formed by deposition of a resist material, followed by lithographic patterning, as explained above for forming patterned resist 18.

Figure 10:
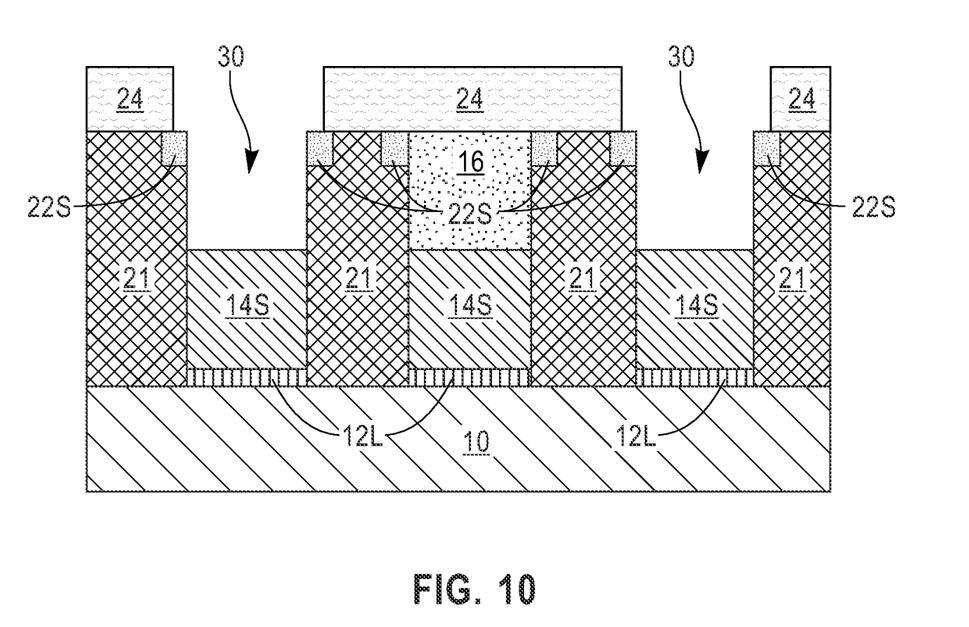
FIG. 10 is a cross sectional view of the exemplary structure shown in FIG. 9A after transferring the via opening into the masking layer to physically expose a portion of the patterned hard mask, and removing the physically exposed portion of patterned hard mask to physically exposed a portion of the metal line.

Referring now to FIG. 10, there is illustrated the exemplary structure shown in FIG. 9 after transferring the via opening 28 into the masking layer 24 to physically expose a portion of the patterned hard mask 16, and removing the physically exposed portion of patterned hard mask 16 to physically exposed a portion of the metal line 14S. After removing the physically exposed portion of patterned hard mask 16, at least one via opening 30 is formed in the interconnect dielectric material layer 21 that physically exposes a portion of the metal line 14S. In the 3D view provided in FIG. 11B, it is shown that a plurality of via openings 30 can be present that physically expose different portions of the same metal line 14S. Each of these via openings is separated from a remaining portion of the patterned hard mask 16 that remains on the metal line 14S. Each remaining portion of the patterned hard mask 16 can be referred to a hard mask wall portion 16P. The hard mask wall portions 16P are not shown in the cross sectional illustrated in FIG. 10 or 11.

The transferring of the via opening 28 into the masking layer 24 includes an etching step (chemical etch or dry etch) that is selective in removing the masking material that provides the masking layer 24. This transfer etch stops on a surface of the patterned hard mask 16. The another patterned resist 26 is removed from the exemplary structure after this transfer etch (i.e., via open step) has been performed. The removal of the another patterned resist 26 includes any conventional resist removal process such as, for example, ashing.

Figure 11A:
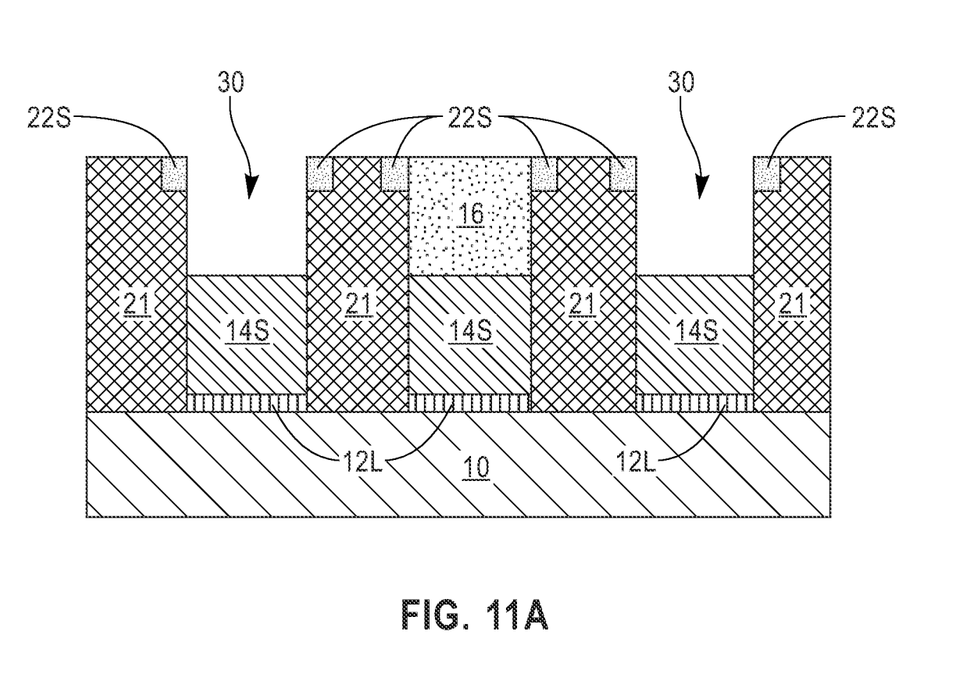
FIG. 11A is a cross sectional view of the exemplary structure shown in FIG. 10 after removing the masking material layer.
Figure 11B:
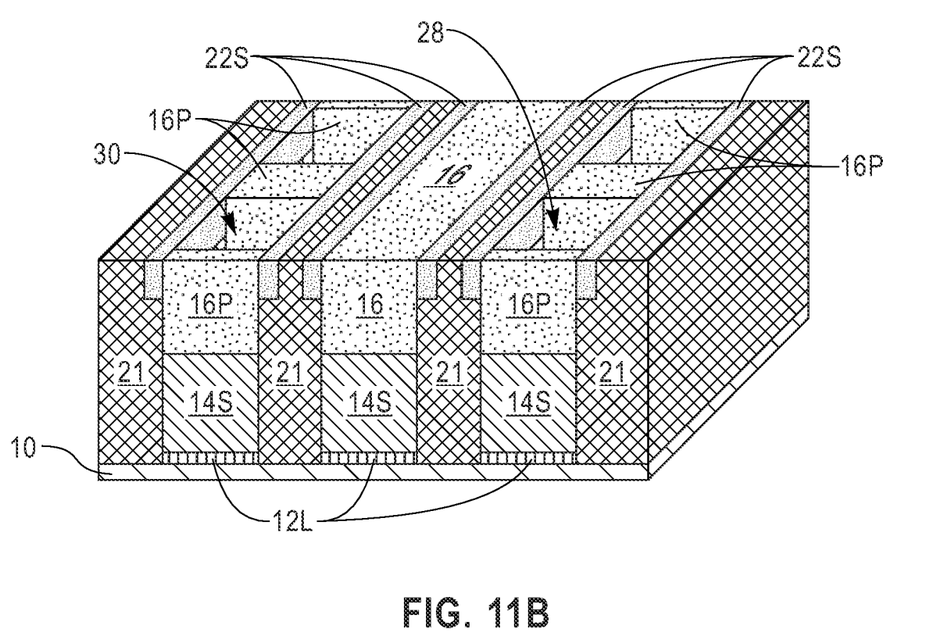
FIG. 11B is a 3D view of the exemplary structure shown in FIG. 11A.

A second etch follows the transfer etch that removes the physically exposed portions of each patterned hard mask 16 forming via openings 30 into the interconnect dielectric material layer 21 that physically expose different portions of the metal line 14S (as is shown in FIG. 11B). In some embodiments, the transfer etch and the second etch that follows the transfer etch are performed in one etch. Via opening 30 is designed to have a density and aspect ratio (ratio of width to height) that are low enough to avoid line wiggling or via distortion. In one embodiment, the via opening 30 has a density is from 0.1% to 30%. In one embodiment, the aspect ratio of the via opening 30 is from 0.5 to 3. Note that this aspect ratio applies to the electrically conductive via structure that is subsequently formed into the via opening 30.

The transferred via opening that is present in the masking layer 24 has a first critical dimension, while the via openings 30 that are formed into the interconnect dielectric material layer 21 have a second critical dimension, wherein the second critical dimension is smaller than the first critical dimension.

Referring now to FIGS. 11A and 11B, there are illustrated the exemplary structure shown in FIG. 10 after removing the masking material layer 24. Masking layer 24 can be removed utilizing any conventional material removal process that is selective in removing the masking material that provides masking layer 24. In one example, and when the masking layer 24 is composed of OP1, an oxygen, $O_2$, etch can be used to remove the masking layer 24 from the exemplary structure. The removal of the masking material layer 24 stops on the dielectric spacer 22S and the interconnect dielectric material layer 21.

Figure 12:
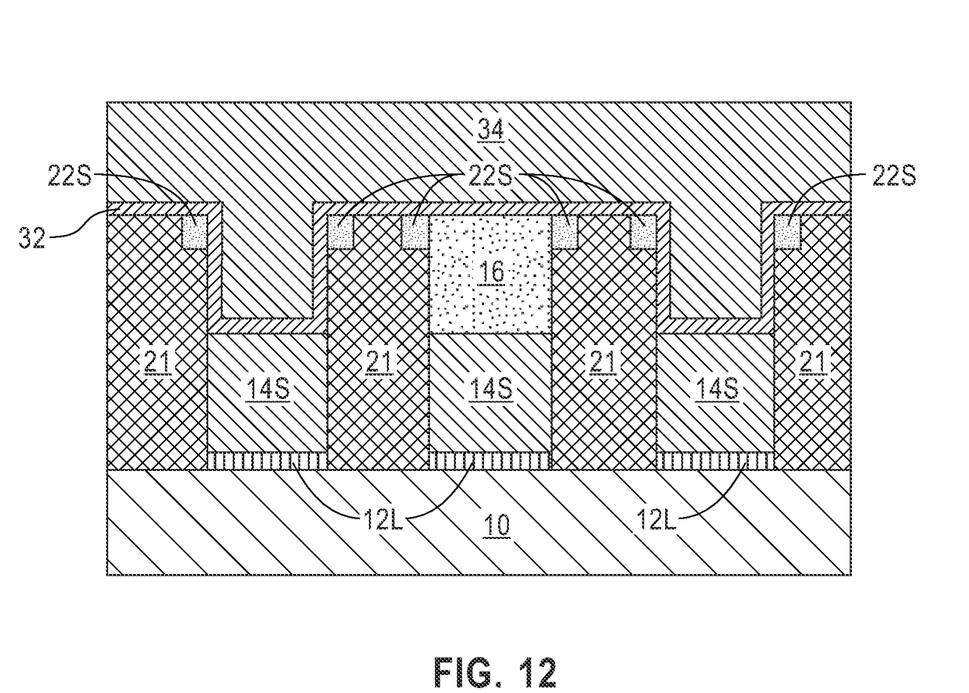
FIG. 12 is a cross sectional view of the exemplary structure shown in FIG. 11A after forming a second diffusion barrier layer and an electrically conductive material layer inside and outside of the via opening.

Referring now to FIG. 12, there is illustrated the exemplary structure shown in FIG. 11A after forming a second diffusion barrier layer 32 and an electrically conductive material layer 34 inside and outside of the via opening 30. In some embodiments, the second diffusion barrier layer 32 can be omitted.

The second diffusion barrier layer 32 includes one of the diffusion barrier materials mentioned above for the first diffusion barrier layer 12. The second diffusion barrier layer 32 can be composed of a compositionally same, or compositionally different, diffusion barrier material than the first diffusion barrier layer 12. The second diffusion barrier layer 32 can be formed utilizing one of the deposition processes mentioned above for forming the first diffusion barrier layer 12, and the second diffusion barrier layer 32 can have a thickness from 5 nm to 20 nm; other thicknesses are contemplated for the second diffusion barrier layer 32 so long as the second diffusion barrier layer 32 does not fill the entire volume of via opening 30.

The electrically conductive material layer 34 is composed of an electrically conductive metal or electrically conductive metal alloy. Examples of electrically conductive metals that can be employed in providing the electrically conductive material layer 34 include, but are not limited to, Cu, Al, W, Co, Mo, Ru, Rh or Ir. Examples of electrically conductive metal alloys include, but are not limited to, a Cu—Al alloy. The electrically conductive material that provides the electrically conductive material layer 34 can be compositionally the same as, or compositionally different from, the electrically conductive material that provides metal layer 14. The electrically conductive material layer 34 can be formed utilizing a deposition process such as, for example, CVD, PECVD, sputtering, chemical solution deposition or plating. In one embodiment, a bottom-up plating process can be employed in forming the electrically conductive material layer 34.

Figure 13A:
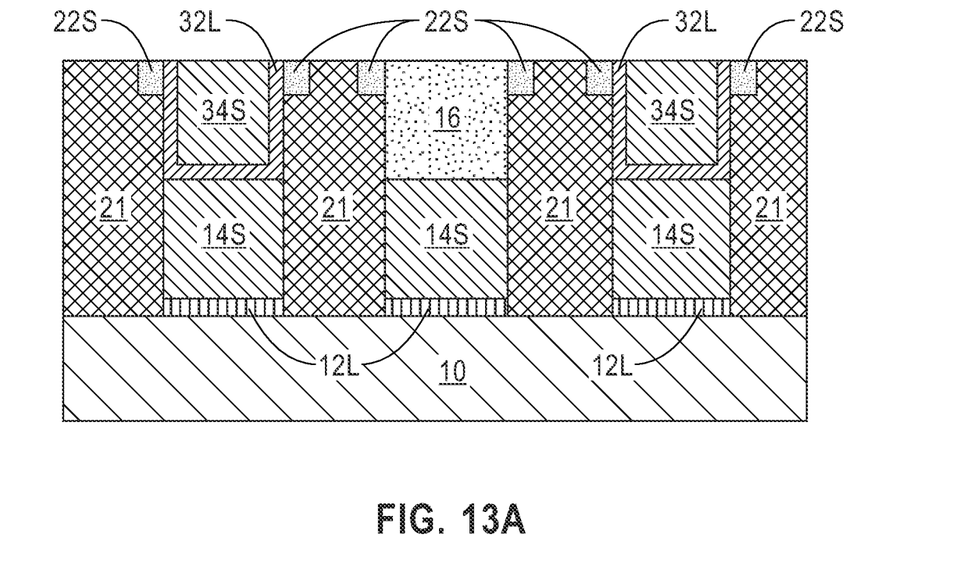
FIG. 13A is a cross sectional view of the exemplary structure shown in FIG. 12 after removing the second diffusion barrier layer and the electrically conductive material layer that is located outside of the via opening, while maintaining both the second diffusion barrier layer and the electrically conductive material layer inside the via opening.
Figure 13B:
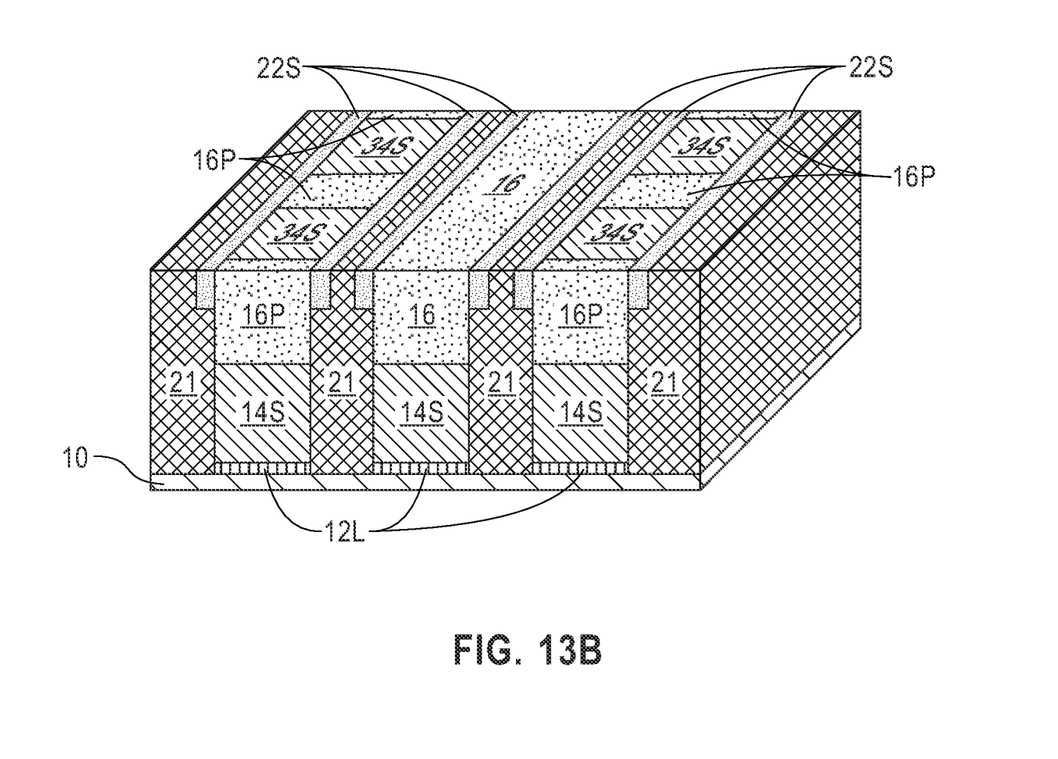
FIG. 13B is a 3D view of the exemplary structure shown in FIG. 13A.

Referring lastly to FIGS. 13A and 13B, there are shown the exemplary structure shown in FIG. 12 after removing the second diffusion barrier layer 32 and the electrically conductive material layer 34 that is located outside of the via opening 30, while maintaining both the second diffusion barrier layer 32 and the electrically conductive material layer 34 inside the via opening 30. The second diffusion barrier layer 32 that is maintained in the via opening 30 can be referred to herein as a second diffusion barrier liner 32L. The electrically conductive material layer 34 that is maintained in the via opening 30 can be referred to herein as an electrically conductive via structure 34S. As is shown in FIG. 13B, each electrically conductive via structure 34S has a first sidewall and a second sidewall that is opposite the first sidewall, laterally adjacent to one of the hard mask wall portions 16P. The first and second sidewalls referred to herein are along the width-wise direction of the underling metal line 14S. Also, each electrically conductive via structure 34 has a third sidewall and a four sidewall, opposite the third sidewalls, laterally adjacent to a portion of dielectric spacer 22S. The third and fourth sidewalls referred to herein are along the length-wise direction of the underling metal line 14S. Note that the 3D view provided by FIG. 13B shows an embodiment without the second diffusion barrier liner 32L.

The second diffusion barrier liner 32L is U-shaped. By "U-shaped" it is meant that the liner has a horizontal portion and a vertical portion that extends upward from each end of the horizontal portion. In the illustrated embodiment shown in FIG. 13A, the U-shaped second diffusion barrier liner 32L is located on the sidewalls and bottommost surface of the electrically conductive via structure 34S. Other structural configurations are possible depending on whether the second diffusion barrier layer 32 is employed.

Each electrically conductive via structure 34S has a topmost surface that is coplanar with a topmost surface of each hard mask wall portion 16P, the second diffusion barrier liner 32L (if the same is present), dielectric spacers 22, and the interconnect dielectric material layer 21. Other structural configurations are possible depending on whether the second diffusion barrier layer 32 is employed. Note that the dielectric spacers 22 run along the entire length (i.e., the length-wise direction) of metal line 14S and separate an upper portion of each electrically conductive via structure 34S and each hard mask wall portion 16P from the interconnect dielectric material layer 21. Also, each electrically conductive via structure 34S that runs atop a metal line 14S is spaced apart from each other by a hard mask wall portion 16P.

The removal of the second diffusion barrier layer 32 and the electrically conductive material layer 34 that are located outside the via opening 30 (and thus on top of the interconnect dielectric material layer 21 and dielectric spacers 22) can be performed utilizing a planarization process such as, for example, chemical mechanical polishing (CMP) and/or grinding. In the illustrated embodiment, the planarization stops on a topmost surface of the interconnect dielectric material layer 21 and dielectric spacers 22.

FIGS. 13A and 13B illustrates an interconnect structure in accordance with the present application. The interconnect structure includes an interconnect dielectric material layer 21 embedding both a metal line 14S and at least one electrically conductive via structure 34S. The at least one electrically conductive via structure 34S is fully-aligned to, and is located above, the metal line 14S, and the metal line 14S has a length. A hard mask wall portion 16P is located laterally adjacent to each of a first sidewall and a second sidewall of the at least one electrically conductive via structure 34S, wherein the first sidewall is opposite the second sidewall. A dielectric spacer 22S is present that runs an entire length of the metal line 14S and separates an upper portion of each of the least one electrically conductive via structure 34S and the hard mask wall portion 16P from the interconnect dielectric material layer 21.

It is noted that some of the metal lines 14S (see the middle one shown in FIGS. 13A and 13B, for example) only include the patterned hard mask 16 located on an entirety thereof. For these metal lines, dielectric spacer 22S runs an entire length of the metal line 14S and is located laterally adjacent to an entire length of the patterned hard mask 16.

The interconnect structure of the present application has a maximized contact area between the at least one electrically conductive via structure 34S and the metal line 14S without metal fangs that are caused by over etching. The dielectric surface of the interconnect dielectric material layer 21 that is adjacent to the at least one electrically conductive via structure 34S is free of RIE damage. Further, there is no line wiggling since the metal line 14S is formed by a substrative metal etch. Further, there is no via distortion since the via opening 30 used to house the at least one electrically conductive via structure 34S has a density and aspect ratio that are low enough to avoid via distortion.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An interconnect structure comprising:
an interconnect dielectric material layer embedding both a metal line and at least one electrically conductive via structure, wherein the at least one electrically conductive via structure is fully-aligned to, and is located above, the metal line, and the metal line has a length;
a hard mask wall portion located laterally adjacent to each of a first sidewall and a second sidewall of the at least one electrically conductive via structure, wherein the first sidewall is opposite the second sidewall; and
a dielectric spacer running an entire length of the metal line and separating an upper portion of each of the at least one electrically conductive via structure and the hard mask wall portion from the interconnect dielectric material layer, wherein the hard mask wall portion has a topmost surface that is coplanar with a topmost surface of both the dielectric spacer and with the at least one electrically conductive via structure.

2. The interconnect structure of claim 1, further comprising a first diffusion barrier liner located entirely beneath the metal line.

3. The interconnect structure of claim 2, further comprising a substrate located beneath the first diffusion barrier liner.

4. The interconnect structure of claim 2, further comprising a second diffusion barrier liner located on sidewalls and a bottom wall of the at least one electrically conductive via structure.

5. The interconnect structure of claim 1, wherein the at least one electrically conductive via structure includes a plurality of spaced apart electrically conductive via structures that are located over different portions of the metal line.

6. The interconnect structure of claim 5, wherein each electrically conductive via structure of the plurality of spaced apart electrically conductive via structures is separated from each other by one of the hard mask wall portions.

7. The interconnect structure of claim 1, wherein the metal line is composed of a non-copper containing electrically conductive metal or a non-copper containing electrically conductive metal alloy.

8. The interconnect structure of claim 7, wherein the metal line is composed of Co, Mo, Ru, Rh Ir or an alloy thereof.

9. The interconnect structure of claim 1, wherein the at least one electrically conductive via structure is composed of an electrically conductive metal or an electrically conductive metal alloy.

10. The interconnect structure of claim 9, wherein the at least one electrically conductive via structure is composed of Cu, Al, W, Co, Mo, Ru, Rh, Ir or alloys thereof.

11. The interconnect structure of claim 1, wherein the metal line is composed of a first electrically conductive material and the at least one electrically conductive via structure is composed of a second electrically conductive material that is compositionally the same as the first electrically conductive material, and the first electrically conductive material is a non-copper containing electrically conductive metal or a non-copper containing electrically conductive metal alloy.

12. The interconnect structure of claim 1, further comprising another metal line located laterally adjacent to, and spaced apart from the metal line, wherein the another metal line has a patterned hard mask located on an entirety thereof.

13. The interconnect structure of claim 12, further comprises another dielectric spacer located laterally adjacent to an upper portion of the patterned hard mask that is located on the another metal line.

14. The interconnect structure of claim 1, wherein the interconnect dielectric material layer is composed of flowable dielectric material having a dielectric constant of less than 4.0.

15. The interconnect structure of claim 1, wherein the at least one electrically conductive via structure has an aspect ratio of from 0.5 to 3.

16. The interconnect structure of claim 1, wherein the metal line is absence line wiggling, and the at least one electrically conductive via structure is absent via distortion.

17. An interconnect structure comprising:
an interconnect dielectric material layer embedding both a metal line and at least one electrically conductive via structure, wherein the at least one electrically conductive via structure is fully-aligned to, and is located above, the metal line, and the metal line has a length;
a hard mask wall portion located laterally adjacent to each of a first sidewall and a second sidewall of the at least one electrically conductive via structure, wherein the first sidewall is opposite the second sidewall; and
a dielectric spacer running an entire length of the metal line and separating an upper portion of each of the at least one electrically conductive via structure and the hard mask wall portion from the interconnect dielectric material layer, wherein the dielectric spacer has a first sidewall in direct physical contact with a sidewall of the at least one electrically conductive via structure and a second sidewall, opposite the first sidewall, that is in direct physical contact with the interconnect dielectric material layer.

18. An interconnect structure comprising:
an interconnect dielectric material layer embedding both a metal line and at least one electrically conductive via structure, wherein the at least one electrically conductive via structure is fully-aligned to, and is located above, the metal line, and the metal line has a length;
a hard mask wall portion located laterally adjacent to each of a first sidewall and a second sidewall of the at least one electrically conductive via structure, wherein the first sidewall is opposite the second sidewall, and the hard mask wall portion has a same width as a width of the at least one electrically conductive via structure; and
a dielectric spacer running an entire length of the metal line and separating an upper portion of each of the at least one electrically conductive via structure and the hard mask wall portion from the interconnect dielectric material layer.

* * * * *